United States Patent
Li et al.

(10) Patent No.: US 11,282,953 B2
(45) Date of Patent: Mar. 22, 2022

(54) TRANSISTOR DEVICES AND METHODS OF FORMING A TRANSISTOR DEVICE

(71) Applicant: GLOBALFOUNDRIES Singapore Pte. Ltd., Singapore (SG)

(72) Inventors: Ming Li, Singapore (SG); Sivaramasubramaniam Ramasubramaniam, Singapore (SG); Dong Hyun Shin, Singapore (SG); Di Wu, Singapore (SG); Yunpeng Xu, Singapore (SG); Chenji Zou, Singapore (SG); Jeoung Mo Koo, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/847,750

(22) Filed: Apr. 14, 2020

(65) Prior Publication Data
US 2021/0320203 A1    Oct. 14, 2021

(51) Int. Cl.
*H01L 29/78*   (2006.01)
*H01L 21/02*   (2006.01)
(Continued)

(52) U.S. Cl.
CPC ...... *H01L 29/7816* (2013.01); *H01L 21/0223* (2013.01); *H01L 21/31111* (2013.01); *H01L 21/76224* (2013.01); *H01L 29/41725* (2013.01); *H01L 29/66681* (2013.01); *H01L 21/02255* (2013.01)

(58) Field of Classification Search
CPC ........... H01L 29/7816; H01L 29/66681; H01L 29/41725; H01L 29/42368; H01L 29/7835; H01L 29/0649–0653; H01L 21/76224; H01L 21/76229
See application file for complete search history.

(56) References Cited

U.S. PATENT DOCUMENTS 8,921,938 B1 * 12/2014 Zhang ................. H01L 29/7816
                                                                257/343
2005/0285200 A1 * 12/2005 Kim ..................... H01L 27/0266
                                                                257/360
(Continued)

OTHER PUBLICATIONS

Lee et al, "0.35μm, 30V Fully Isolated and Low-Ron nLDMOS for DC-DC Applications", Proceedings of the 25th International Symposium on Power Semiconductor Devices & ICs, 2013, pp. 163-166, IEEE.
(Continued)

*Primary Examiner* — Errol V Fernandes
*Assistant Examiner* — Jeremy J Joy
(74) *Attorney, Agent, or Firm* — Viering Jentschura & Partner Mbb (57) ABSTRACT

According to various embodiments, a transistor device may include a substrate. The transistor device may further include a drain terminal and a source terminal formed in the substrate, and a gate terminal formed over the substrate. The transistor device may further include an insulator structure arranged between the drain terminal and the source terminal, and at least partially under the gate terminal. The insulator structure may include an oxide member and a trench isolation region. The oxide member may be at least partially formed over the trench isolation region.

20 Claims, 9 Drawing Sheets

(51) Int. Cl.
  *H01L 21/311* (2006.01)
  *H01L 21/762* (2006.01)
  *H01L 29/417* (2006.01)
  *H01L 29/66* (2006.01)

(56) References Cited

U.S. PATENT DOCUMENTS

| | | | | |
|---|---|---|---|---|
| 2007/0235779 A1* | 10/2007 | Dietz | .................. | H01L 29/7835 257/288 |
| 2009/0140335 A1* | 6/2009 | Schneider | ........... | H01L 29/0847 257/344 |
| 2010/0032773 A1* | 2/2010 | Shrivastava | ........ | H01L 29/0653 257/408 |
| 2012/0280319 A1* | 11/2012 | Roehrer | ............ | H01L 29/66681 257/337 |
| 2013/0181287 A1* | 7/2013 | Zhang | ............... | H01L 21/28211 257/335 |
| 2013/0187231 A1* | 7/2013 | Lai | ...................... | H01L 29/1095 257/355 |
| 2013/0341717 A1* | 12/2013 | Chen | ................. | H01L 29/66659 257/337 |
| 2015/0187931 A1* | 7/2015 | Yoo | ................... | H01L 29/66681 257/339 |
| 2015/0270333 A1* | 9/2015 | Yang | ....................... | H01L 29/36 257/337 |
| 2016/0181419 A1* | 6/2016 | Ryu | .................... | H01L 29/7835 257/343 |
| 2017/0194490 A1* | 7/2017 | Li | ........................ | H01L 29/0692 |
| 2018/0130903 A1* | 5/2018 | Lin | ......................... | H01L 29/47 |
| 2019/0288063 A1* | 9/2019 | Komatsu | ............. | H01L 29/0847 |
| 2020/0020801 A1* | 1/2020 | Ryu | ..................... | H01L 29/7835 |

OTHER PUBLICATIONS

Jin et al., "Best-in-Class LDMOS with Ultra-Shallow Trench Isolation and P-Buried Layer from 18V to 40V in 0.18μm BCD Technology", Proceedings of the 29th International Symposium on Power Semiconductor Devices and ICs, 2017, pp. 295-298, IEEE.

Sharma et al., "Planar Dual Gate Oxide LDMOS Structures in 180nm Power Management Technology", Proceedings of the 2012 24th International Symposium on Power Semiconductor Devices and ICs, 2012, pp. 405-408, IEEE.

* cited by examiner

TRANSISTOR DEVICES AND METHODS OF FORMING A TRANSISTOR DEVICE

TECHNICAL FIELD

Various embodiments relate to transistor devices and methods of forming a transistor device, in particular, laterally-diffused metal-oxide semiconductor transistor devices.

BACKGROUND

Laterally-diffused metal-oxide semiconductor (LDMOS) transistors are widely used in high voltage (HV) radio frequency power amplifiers for mobile networks. The structure of a LDMOS transistor may include an electrical insulation structure in the LDMOS drift region, between the channel region under the gate and the drain region. One method of forming the electrical insulation structure is by local oxidation of silicon (LOCOS). In the LOCOS process, selected areas of the silicon wafer are converted to silicon dioxide by thermal oxidation of silicon at around 800 to 1200° C. Remaining areas of the silicon wafer that not meant to be oxidized may be coated in a material such as silicon nitride that is impermeable to oxygen at high temperatures. Forming the electrical insulation structure by LOCOS has several disadvantages. Silicon dioxide has a larger volume than silicon, so the growth of the silicon dioxide may create tension in the silicon wafer, which may damage electronic devices in the silicon wafer. The LOCOS process also requires a high thermal budget. Another method of forming the electrical insulation structure is to form ultra-shallow trench isolation (USTI). In these processes, ultra-shallow trenches are formed and silicon dioxide is deposited in the trenches. Using USTI as the electrical insulation structure has the disadvantage that the corner of the USTI may become very thin as a result of thermal oxidation causing electrical field to be focused at the thin corner, thereby degrading the hot carrier injection (HCI) performance of the LDMOS. As such, there is a need for an improved method of forming the electrical insulation structure in a LDMOS.

SUMMARY

According to various embodiments, there may be provided a transistor device. The transistor device may include a substrate. The transistor device may further include a drain terminal and a source terminal formed in the substrate, and a gate terminal formed over the substrate. The transistor device may further include an insulator structure arranged between the drain terminal and the source terminal, at least partially under the gate terminal. The insulator structure may include an oxide member and a trench isolation region. The oxide member may be at least partially formed over the trench isolation region.

According to various embodiments, there may be provided a method of forming a transistor device. The method may include: providing a substrate, forming a drain terminal and a source terminal in the substrate, forming a gate terminal over the substrate, and forming an insulator structure. The insulator structure may be formed between the drain terminal and the source terminal, and at least partially under the gate terminal. Forming the insulator structure may include forming a trench isolation region and forming an oxide member at least partially over the trench isolation region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Embodiments described below in context of the devices are analogously valid for the respective methods, and vice versa. Furthermore, it will be understood that the embodiments described below may be combined, for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

In order that the invention may be readily understood and put into practical effect, various embodiments will now be described by way of examples and not limitations, and with reference to the figures.

According to various embodiments, a transistor may include one or more electrical insulation structures. The transistor may be a LDMOS transistor. The electrical insulation structure, also referred herein as an insulation structure, may be adjacent to the drain region of the transistor, and may be arranged at least partially under the gate of the transistor. The insulation structure may be arranged between a channel region of the transistor and the drain region. The insulation structure may include a trench isolation region and a step oxide member deposited over the trench isolation region. The step oxide member may also be referred herein as an oxide member. The trench isolation region may be a shallow trench isolation (STI) or a USTI. The trench isolation region may be filled with an electrical insulator or a dielectric material, for example, an oxide such as silicon dioxide. The step oxide member may also include an oxide. The step oxide member may be identical in material composition as the trench isolation region. The step oxide member may directly contact the trench isolation region. The step oxide member may overlap with an entire upper top surface of the trench isolation region, or at least partially overlap with a portion of the upper top surface of the trench isolation region that lies under the gate. The step oxide member may be deposited over the USTI, instead of being formed by oxidizing part of the silicon substrate of the transistor. The step oxide member may be deposited, for example using the process of high temperature oxidation (HTO), or in-situ steam generation (ISSG).

Figure 1:
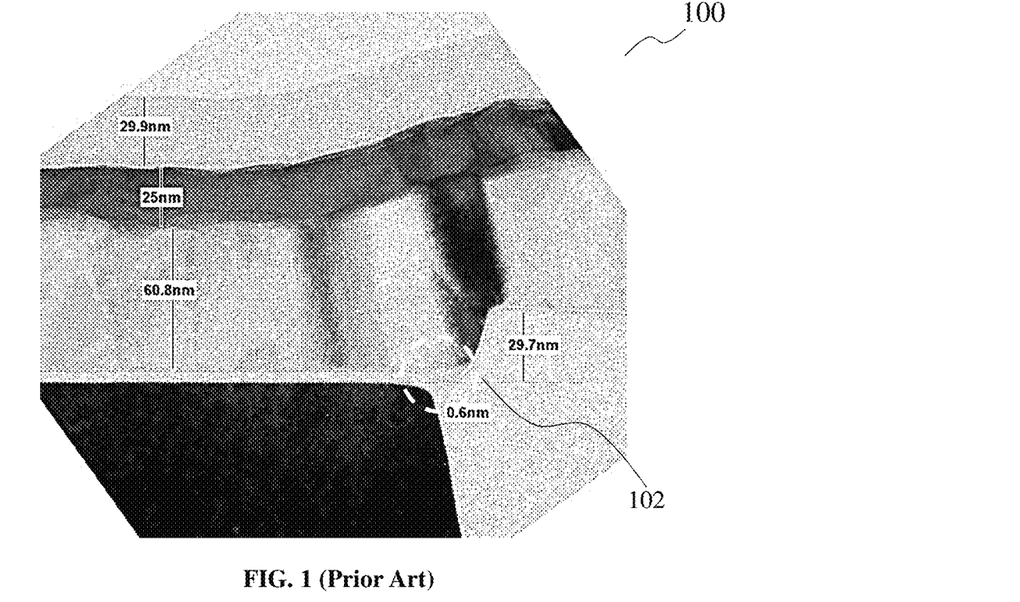
FIG. 1 shows a transmission electron microscopy (TEM) cross-sectional image of an insulation structure in a prior art LDMOS transistor.

FIG. 1 shows a transmission electron microscopy (TEM) cross-sectional image 100 of an insulation structure in a prior art LDMOS transistor. The insulation structure may be a USTI. The circled region 102 shows a corner of the USTI where the oxide of the USTI is very thin. Thinning of the corner oxide may be inevitable in the fabrication process of the insulation structure, as a result of thermal oxidation. The thinning of the corner oxide may cause poor HCI performance of the LDMOS transistor as the electrical field may be focused on the thin corner, instead of being uniformly distributed.

Figure 2:
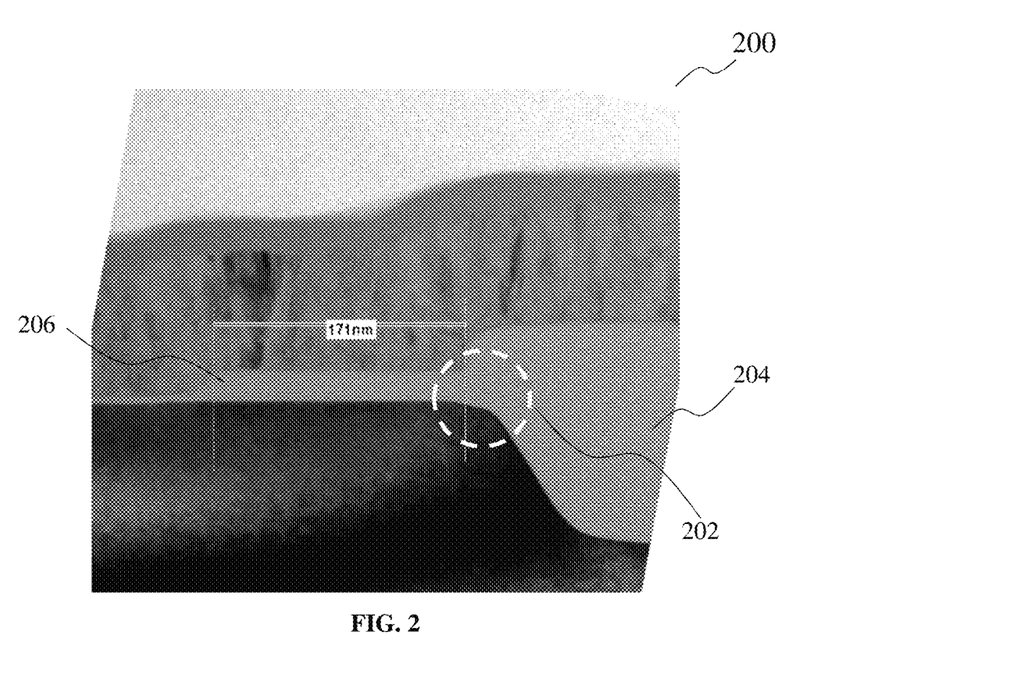
FIG. 2 shows a TEM cross-sectional image of an insulation structure in a LDMOS transistor according to various embodiments.

FIG. 2 shows a TEM cross-sectional image 200 of an insulation structure in a LDMOS transistor according to various embodiments. The image 200 is a magnified view of a section 502 of FIG. 5. The insulation structure may include a USTI 204 and a step oxide member 206. The step oxide member 206 may increase a thickness of the insulation structure at the corner of the USTI as shown in the circled region 202, as compared to the insulation structure shown in FIG. 1. The thick corner of the insulation structure may prevent electrical field from being concentrated at the corner of the insulation structure. The LDMOS transistor may achieve a better electrical test and HCI performance as compared to the LDMOS transistor of FIG. 1.

FIGS. 3A to 3H show a method of forming an insulator structure of a transistor device according to various embodiments, through partial cross-sectional views of the transistor device. The transistor device may be a LDMOS transistor.

Figure 3A:
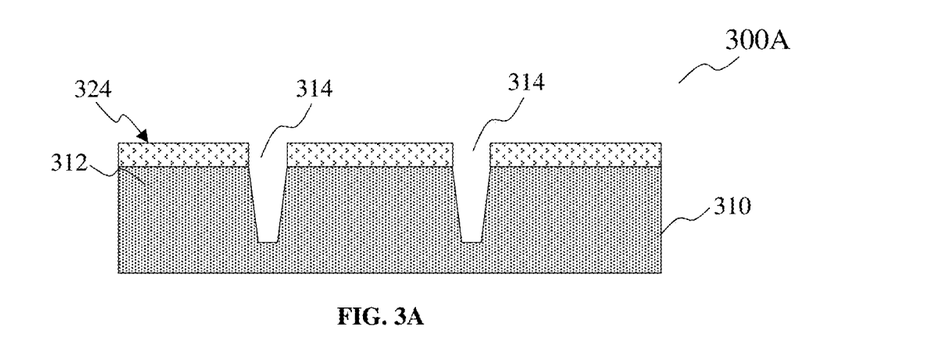
FIGS. 3A to 3H show a method of forming an insulator structure of a transistor device according to various embodiments, through partial cross-sectional views of the transistor device.

FIG. 3A shows a process 300A according to various embodiments. The process 300A may include providing a substrate 310. The substrate 310 may include silicon, or other suitable semiconductor materials. The process 300A may include depositing a mask layer 312 over the substrate 310. The mask layer 312 may include a nitride, for example, silicon nitride. The process 300A may further include forming a plurality of shallow trenches 314 that extend from a top surface 324 of the mask layer 312 into the substrate 310. Forming the plurality of shallow trenches 314 may include etching the mask layer 312 and the substrate 310.

Figure 3B:
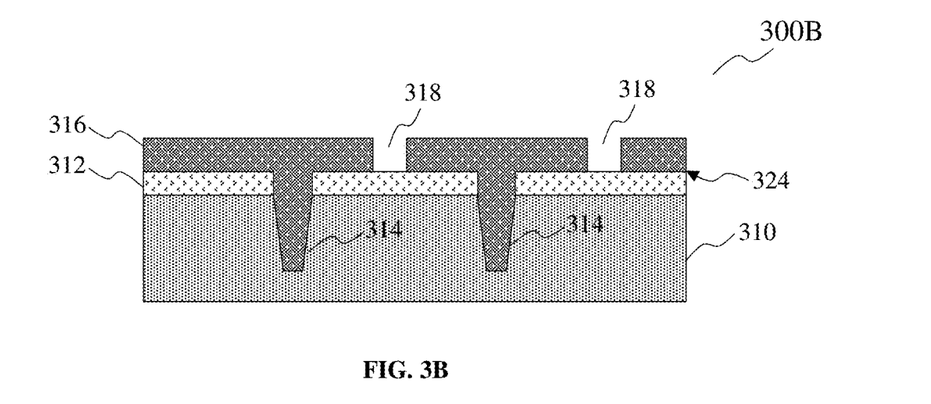

FIG. 3B shows a process 300B according to various embodiments. The process 300B may include depositing a photoresist material 316 over the device resulting from the process 300A. The photoresist material 316 may be deposited over the mask layer 312. The photoresist material 316 may fill up the plurality of trenches 314. The process 300B may include forming a plurality of cavities 318 in the photoresist material 316. The plurality of cavities 318 may extend from a top surface of the photoresist material 316 to the top surface 324 of the mask layer 312. The depth of each cavity 318 may be identical to the thickness of the photoresist material 316 that lies above the mask layer 312. The plurality of cavities 318 may be laterally offset from the plurality of shallow trenches 314.

Figure 3C:
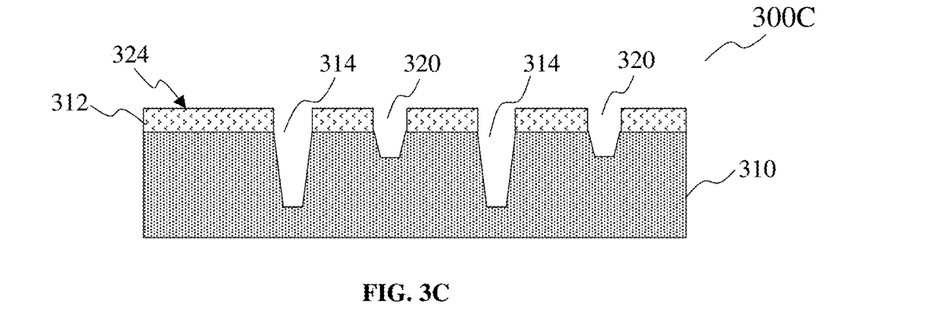

FIG. 3C shows a process 300C according to various embodiments. The process 300C may include removing part of the substrate 310 that lies under the plurality of cavities 318. The process 300C may include etching the substrate 310 with the photoresist material 316 serving as an etch mask. The process 300C may cause the plurality of cavities 318 to extend partially into the substrate 310, to form a plurality of ultra-shallow trenches 320. The depth of each ultra-shallow trench 320 may be smaller than the depth of each shallow trench 314. For example, the shallow trench 314 may be about 300 to 320 nm in depth; whereas, the ultra-shallow trench 320 may be about 90 to 120 nm in depth. The process 300C may further include removing the photoresist material 316 after forming the plurality of ultra-shallow trenches 320.

Figure 3D:
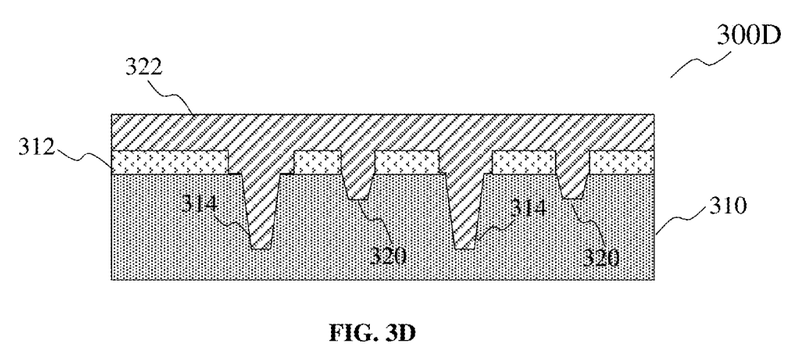

FIG. 3D shows a process 300D according to various embodiments. The process 300D may include depositing an insulator material 322 over the device resulting from the process 300C. The insulator material 322 may include an oxide, for example, silicon dioxide. The insulator material 322 may be deposited by high density plasma (HDP) deposition, ozone tetraethoxysilane (TEOS) process, or high aspect ratio process (HARP). The insulator material 322 may be disposed over the mask layer 312. The insulator material 322 may fill up the plurality of shallow trenches 314 and the plurality of ultra-shallow trenches 320.

Figure 3E:
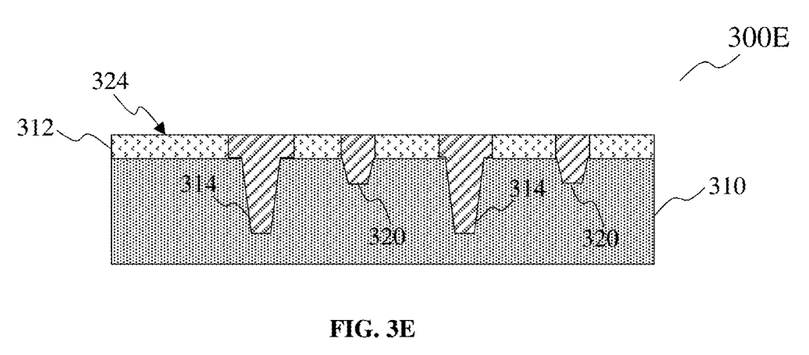

FIG. 3E shows a process 300E according to various embodiments. The process 300E may include planarizing or polishing the insulator material 322 of the device resulting from the process 300C. The thickness of the insulator material 322 may be reduced, such that the insulator material 322 may not extend beyond the top surface 324 of the mask layer 312. The planarized insulator material 322 may fill up the shallow trenches 314 and the ultra-shallow trenches 320 up to the top surface 324 of the mask layer 312.

Figure 3F:
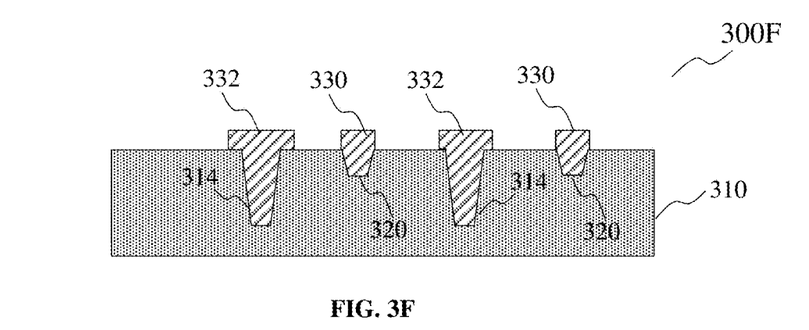

FIG. 3F shows a process 300F according to various embodiments. The process 300F may include removing the mask layer 312. The device resulting from the process 300F includes a plurality of USTI 330 and a plurality of STI 332. Each USTI 330 may include the insulator material 322 that filled a respective ultra-shallow trench 320. Each USTI 330 may extend from above the substrate 310 to a first depth in the substrate 310. Each STI 332 may include the insulator material 322 that filled a respective shallow trench 314. Each STI 332 may extend from above the substrate 310 to a second depth in the substrate 310. The first depth may correspond to the depth of the ultra-shallow trench 320. The second depth may correspond to the depth of the shallow trench 314.

Figure 3G:
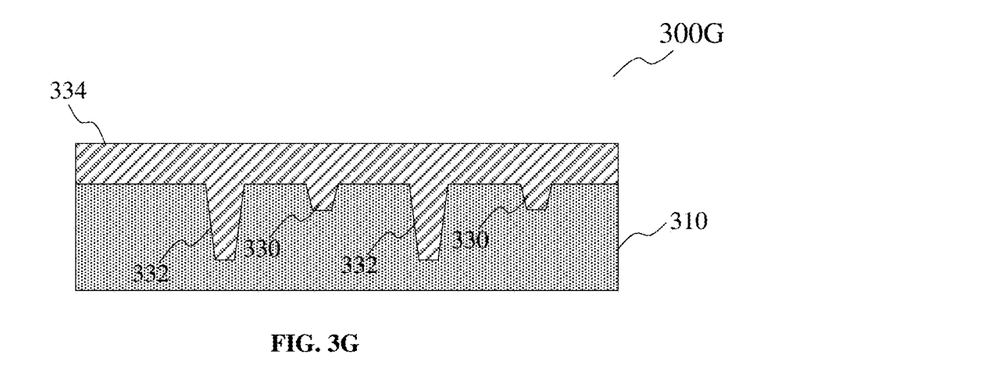

FIG. 3G shows a process 300G according to various embodiments. The process 300G may include providing an oxide material 334 over the device resulting from the process 300F. The oxide material 334 may include silicon dioxide. The oxide material 334 may be identical in material composition, as the insulator material 322. The oxide material 334 may be disposed over the substrate 310, the plurality of USTI 330 and the plurality of STI 332. Providing the oxide material 334 may include depositing the oxide material 334 by high density plasma (HDP) deposition, ozone tetraethoxysilane (TEOS) process, or high aspect ratio process (HARP).

Figure 3H:
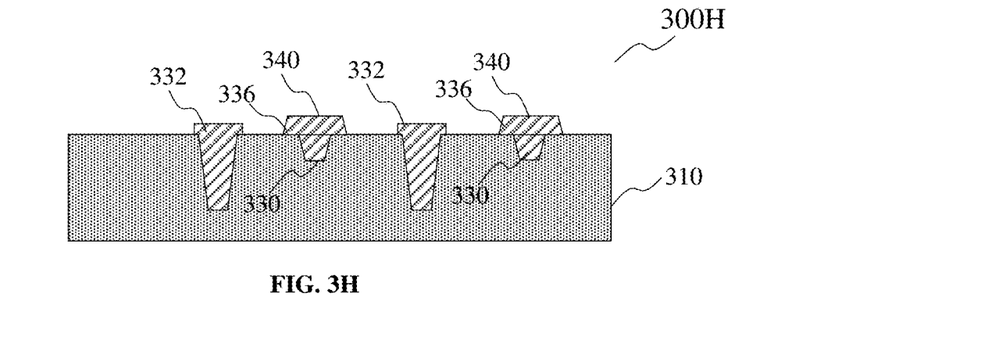

FIG. 3H shows a process 300H according to various embodiments. The process 300H may include forming a plurality of insulator structures 340. Forming the plurality of insulator structures 340 may include forming a respective oxide member 336 over each USTI 330. Each insulator structure 340 may include the oxide member 336 and the respective USTI 330. Forming the oxide members 336 may include etching the oxide material 334 that is deposited in the process 300G, such that the remaining oxide material 334 is provided at least substantially over the USTI. In other words, each oxide member 336 may be disposed above and in contact with a respective USTI 330. Forming the oxide member 336 may include partially removing portions of the deposited oxide material 334 that are in direct contact with the substrate 310. The oxide member 336 may be narrower in width as compared to the USTI 330, such that only part of a top surface of the USTI 330 is covered by the oxide member 336. The oxide member 336 may cover at least a corner of the USTI 330. The oxide member 336 may form a cap over the USTI 330. Here, the oxide member 336 is depicted as being wider than the USTI 330 and covering the entire top surface of the USTI 330.

According to various embodiments, each insulator structure may alternatively include an oxide member 336 disposed above and in contact with a respective STI 332 instead of a respective USTI 330. The drain current (linear) of a LDMOS transistor with the alternative insulator structure may be higher than that of a LDMOS transistor with the insulator structure 340.

According to various embodiments, a method of forming a LDMOS transistor may be provided. The method of forming the LDMOS transistor may include the processes shown in FIGS. 3A to 3H.

Figure 4A:
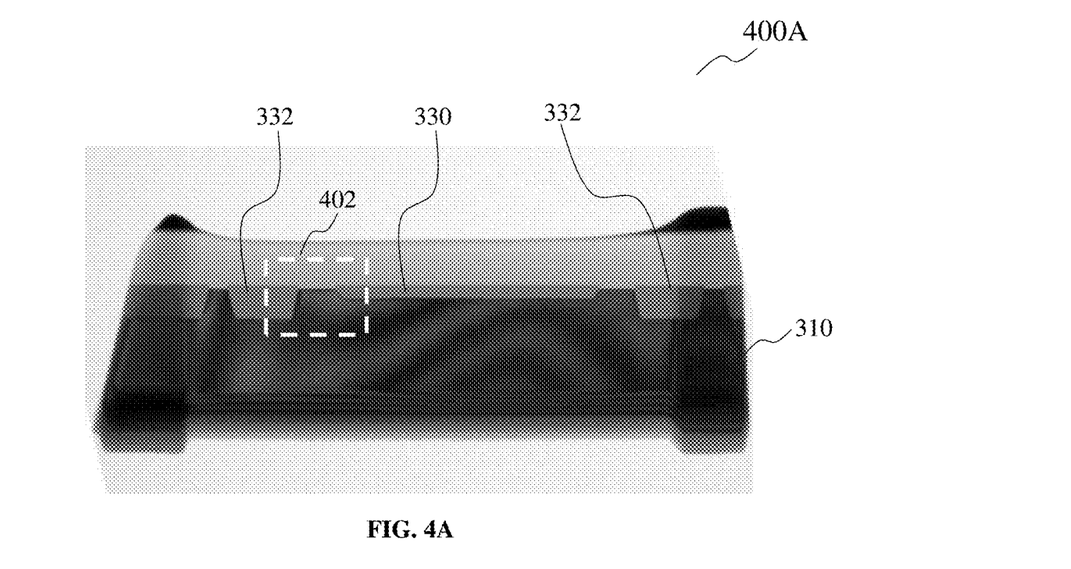
FIG. 4A shows a TEM cross-sectional image of a LDMOS transistor under fabrication, according to various embodiments.

FIG. 4A shows a TEM cross-sectional image 400A of a LDMOS transistor under fabrication, according to various embodiments. The image 400A may correspond to FIG. 3F. The image 400A shows a plurality of STI 332 and a USTI 330. A section 402 of the image 400A is shown in FIG. 4B.

Figure 4B:
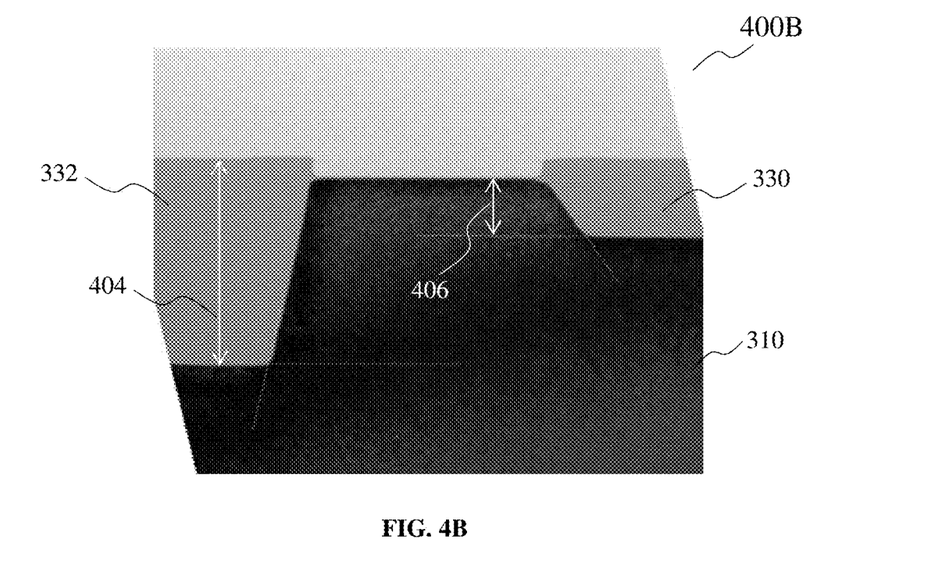
FIG. 4B shows a magnified view of a section of FIG. 4A.

FIG. 4B shows a magnified view 400B of the section 402 of the image 400A. A height 404 (also referred herein as depth) of the STI 332 may be three times or more, of the height 406 (also referred herein as depth) of the USTI 330. The height 404 of the STI 332 shown in the magnified view 400B may be 311.8 nm. The height 406 of the USTI 330 may be 97.1 nm. Due to the difference in height, an insulator structure 340 that includes the USTI 330 instead of the STI 332 may be preferable, as the resulting LDMOS transistor may achieve a lower drain current in the linear operation mode.

Figure 5:
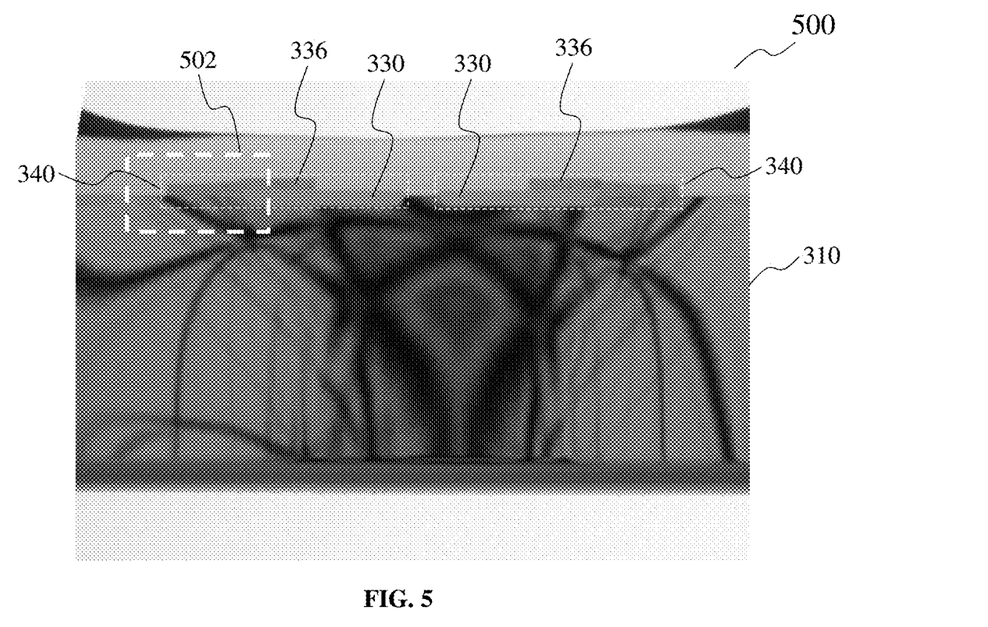
FIG. 5 shows a TEM cross-sectional image of a LDMOS transistor under fabrication, according to various embodiments.

FIG. 5 shows a TEM cross-sectional image 500 of a LDMOS transistor under fabrication, according to various embodiments. A magnified view of the section 502 of the image 500 is shown in FIG. 2. The image 500 corresponds to FIG. 3H, which shows the insulator structures 340.

Figure 6:
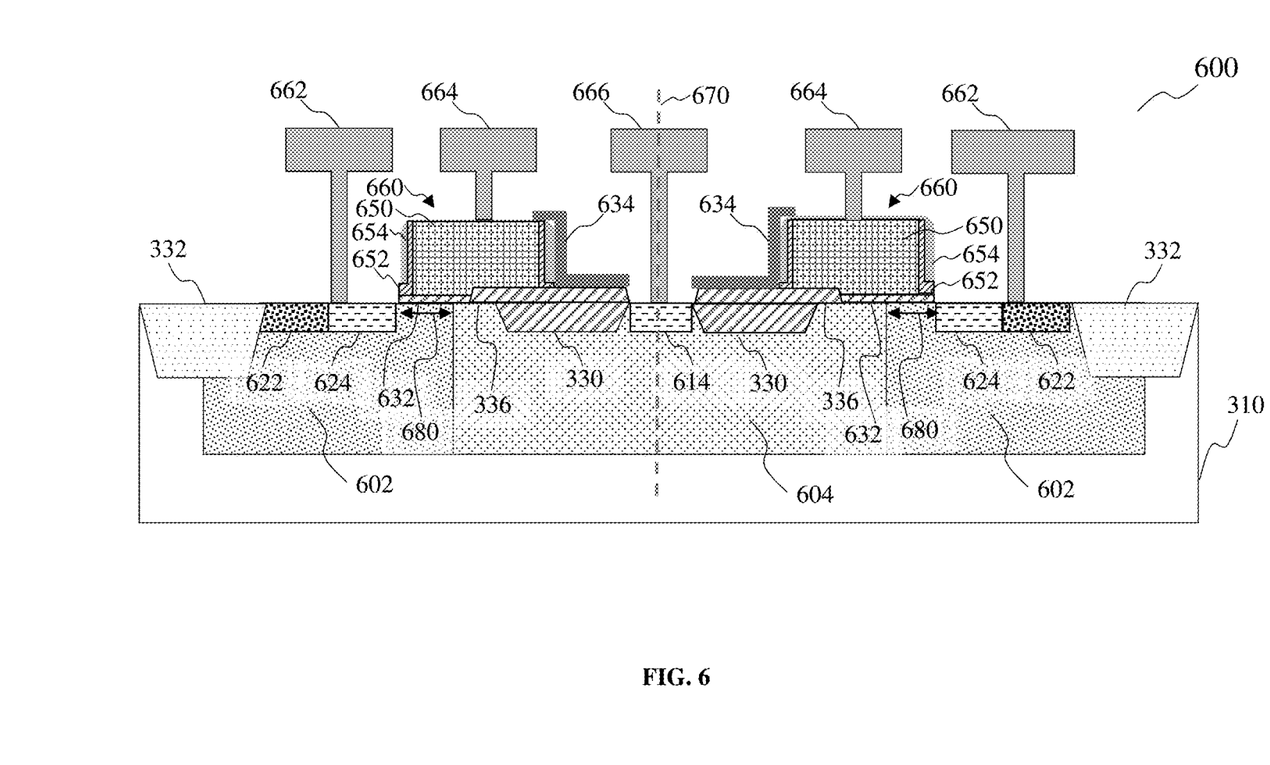
FIG. 6 shows a cross-sectional view of a transistor device according to various embodiments.

FIG. 6 shows a cross-sectional view of a transistor device 600 according to various embodiments. The transistor device 600 may be a LDMOS transistor. The transistor device 600 may include a substrate 310. The substrate 310 may include a drift region 604 and a pair of p-well regions 602. The drift region 604 may lie between the pair of p-well regions 602. Other than the pair of p-well regions 602, the substrate 310 may generally have an n-type conductivity. The p-well regions 602 may be formed in the substrate 310, by introduction of p-type dopants into the substrate 310, for example by diffusion or implantation. The transistor device 600 may include a p+ region 622 and an n+ region 624 formed within each p-well region 602. The p+ region 622 may be adjacent to the n+ region 624. A STI 332 may be disposed adjacent to the p+ region 622. The p+ region 622 in the p-well region 602 may form the source terminal of the transistor device 600. A source electrode 662 may be connected to the n+ region 624. The transistor 600 may include an n+ region 614 within the drift region 604. The n+ region 614 may form the drain terminal of the transistor device 600. A drain electrode 666 may be connected to the n+ region 614. The transistor device 600 may include a gate terminal 660 arranged over the substrate 310. A gate electrode 664 may be connected to the gate terminal 660. The gate terminal 660 may include a polysilicon block 650 arranged over an oxide layer 632. Alternatively, the polysilicon block 650 may be replaced by a metal block. The oxide layer 632 may include a dielectric such as silicon dioxide or silicon oxide. The oxide layer 632 may electrically insulate the gate terminal 660 from the channel between the drain terminal and the source terminal. The gate terminal 660 may include an isolation member 652 at least partially surrounding the polysilicon block 650 and a further isolation member 654 at least partially surrounding the isolation member 652. Both the isolation member 652 and the further isolation member 654 may include electrically insulating materials, for example, oxides and nitrides, for example, silicon oxide and silicon nitrides.

The transistor device 600 may include at least one insulator structure that includes an oxide member 336 and a USTI 330. The insulator structure may be identical to, or at least similar to, the insulator structure 340 formed according to the method described with respect to FIGS. 3A to 3H. The USTI 330 may be disposed within the drift region 604. The USTI 330 may be adjacent to the n+ region 614. The oxide member 336 may be disposed above the drift region 604, and at least partially under the gate terminal 660. The oxide member 336 may come into direct contact with the polysilicon block 650. The transistor device 600 may include a silicide block 634 formed over a side wall of the gate terminal 660 and over part of the oxide member 336. The oxide member 336 may overlap at least one corner of the USTI 330 that lies vertically under the gate terminal 650. The oxide member 336 may at least partially overlap a top surface of the USTI 330 that lies under the gate terminal 660. In other words, the oxide member 336 may at least partially cover a region of the USTI 330 that is under the gate terminal 660. The oxide member 336 may separate the USTI 330 from the gate terminal 660. The transistor device 600 may be symmetrical about a centerline 670 of the n+ region 614. The transistor device 600 may include a pair of gate terminals 660, a pair of insulator structures, a pair of source terminals, a drain terminal and a pair of channel regions 680.

According to various embodiments, each oxide member 336 may cover an entire upper surface of the respective USTI 330. The top surface of the USTI 330 may face the gate terminal 660. The oxide member 336 may at least substantially overlap the entire upper surface of the USTI 330. Alternatively, the oxide member 336 may be narrower than the USTI 330. A terminating end of a bottom surface of the gate terminal 660 may be in direct contact with the oxide member 336. The bottom surface of the gate terminal 660 may face the USTI 330. The USTI 330 may have a first end that faces the channel region of the transistor 660. The channel region may lie between the n+ region 624 and the n+ region 614. The USTI may have a second end that faces the n+ region 614. The oxide member 336 may cover at least the first end of the USTI 330. In other words, the oxide member 336 may overlap a corner of the USTI 330 that lies under the gate terminal 660. The oxide member 336 may at least substantially overlap a portion of the USTI 330 that lies under the gate terminal. The oxide member 336 may be in direct contact with the USTI 330.

Figure 7:
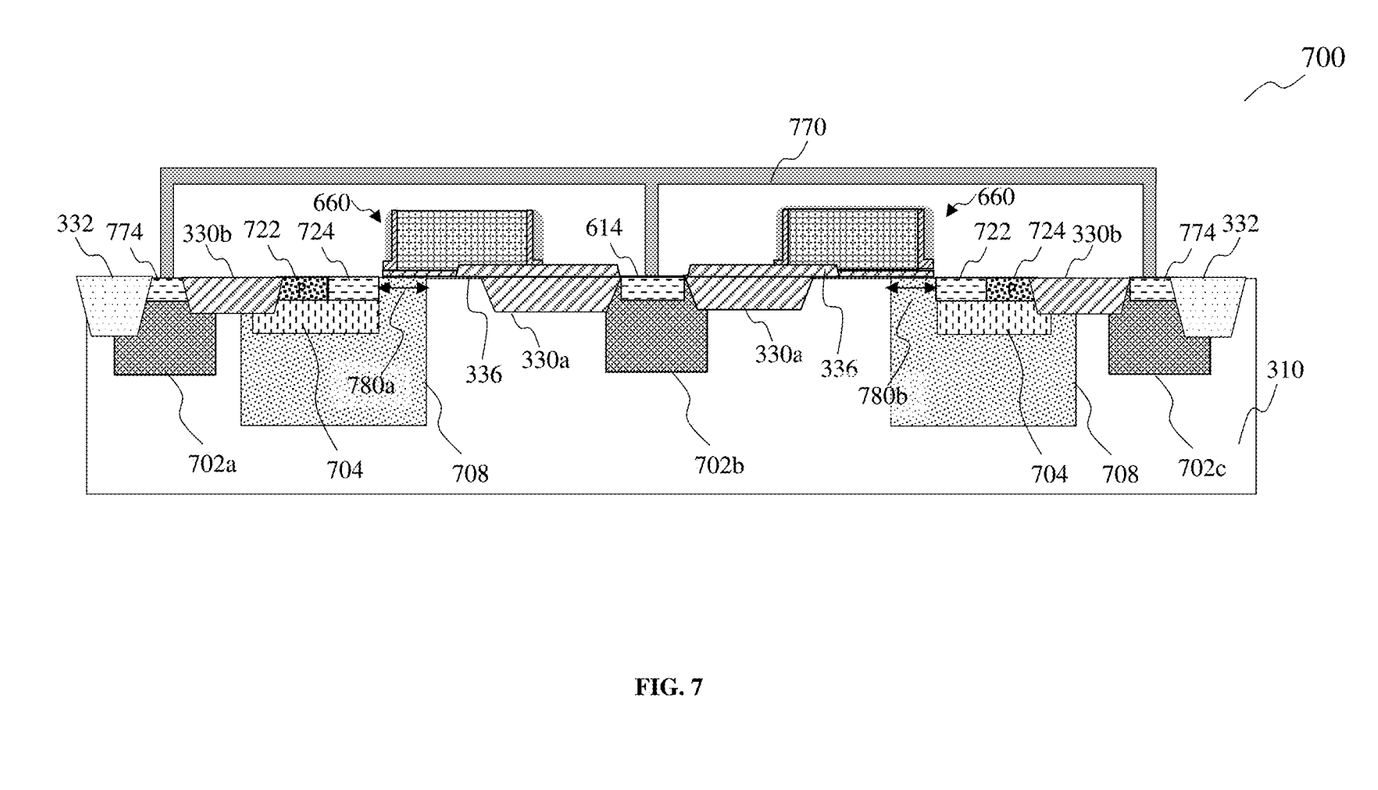
FIG. 7 shows a cross-sectional view of a transistor device according to various embodiments.

FIG. 7 shows a cross-sectional view of a transistor device 700 according to various embodiments. The transistor device 700 may be similar to the transistor device 600, in that it may also be a LDMOS transistor that includes a pair of gate terminals 660, a pair of insulator structures, a pair of source terminals, a drain terminal and a pair of channel regions. The transistor device 700 may be an n-LDMOS transistor with low on-resistance. The transistor device 700 may include a substrate 310. The substrate 310 may include three n-well regions 702a, 702b and 702c. A first channel region 780a may lie between the n-well regions 702a and 702b. The first channel region 780a may lie within the drain extension implant region 708 and adjacent to an n+ region 724.

A second channel region 780b may lie between the n-well regions 702b and 702c. The second channel region 780b may lie within the drain extension implant region 708 and adjacent to a p-type region 722. The n-well regions 702a, 702b and 702c may be formed in the substrate 310, by introduction of n-type dopants into the substrate 310, for example by diffusion or implantation. The transistor device 700 may include a drain extension implant region 708 between the n-well regions 702a and 702b, and another drain extension implant region 708 between the n-well regions 702b and 702c. The transistor device 700 may include an n+ region 774 formed within each respective n-well region 702a and 702c. The transistor device 700 may include the p-type region 722, the n+ region 724, and a body region 704 in each respective drain extension implant region 708. The p-type region 722 may be adjacent to the n+ region 724. The body region 704 may be under both p-type region 722 and the n+ region 724. A STI 332 may be disposed adjacent to the n+ region 774. The n+ region 774 in the n-well region 702 may form the source terminal of the transistor device 700. The transistor device 700 may include an n+ region 614 within the n-well region 702b. The n+ region 614 may form the drain terminal of the transistor device 700. The transistor device 700 may include a gate terminal 660 arranged over the substrate 310. The gate terminal 660 may be identical to the gate terminal described with respect to FIG. 6. The source terminals and the drain terminal may be electrically coupled by a connector 770. The transistor device 700 may include at least one insulator structure that includes an oxide member 336 and a USTI 330a. The insulator structure may be identical to, or at least similar to, the insulator structure 340 formed according to the method described with respect to FIGS. 3A to 3H. The USTI 330a may be disposed partially in the n-well region 702b. The USTI 330a may be adjacent to the n+ region 614. The oxide member 336 may be disposed at least partially under the gate terminal 660. The oxide member 336 may overlap at least one corner of the USTI 330a that lies vertically under the gate terminal 650. The oxide member 336 may at least partially overlap a top surface of the USTI 330a that lies under the gate terminal 660. In other words, the oxide member 336 may at least partially cover a region of the USTI 330a that is under the gate terminal 660. The oxide member 336 may separate the USTI 330a from the gate terminal 660. The transistor device 700 may further include a USTI 330b disposed partially in the n-well region 702a and another USTI 330b disposed partially in the n-well region 702c. Each USTI 330b may be disposed partially within a respective drain extension implant region 708.

According to various embodiments, each oxide member 336 may cover an entire top surface of the respective USTI 330a. The top surface of the USTI 330a may face the gate terminal 660. Alternatively, the oxide member 336 may be narrower than the USTI 330a. A terminating end of a bottom surface of the gate terminal 660 may be in direct contact with the oxide member 336. The bottom surface of the gate terminal 660 may face the USTI 330a.

Figure 8:
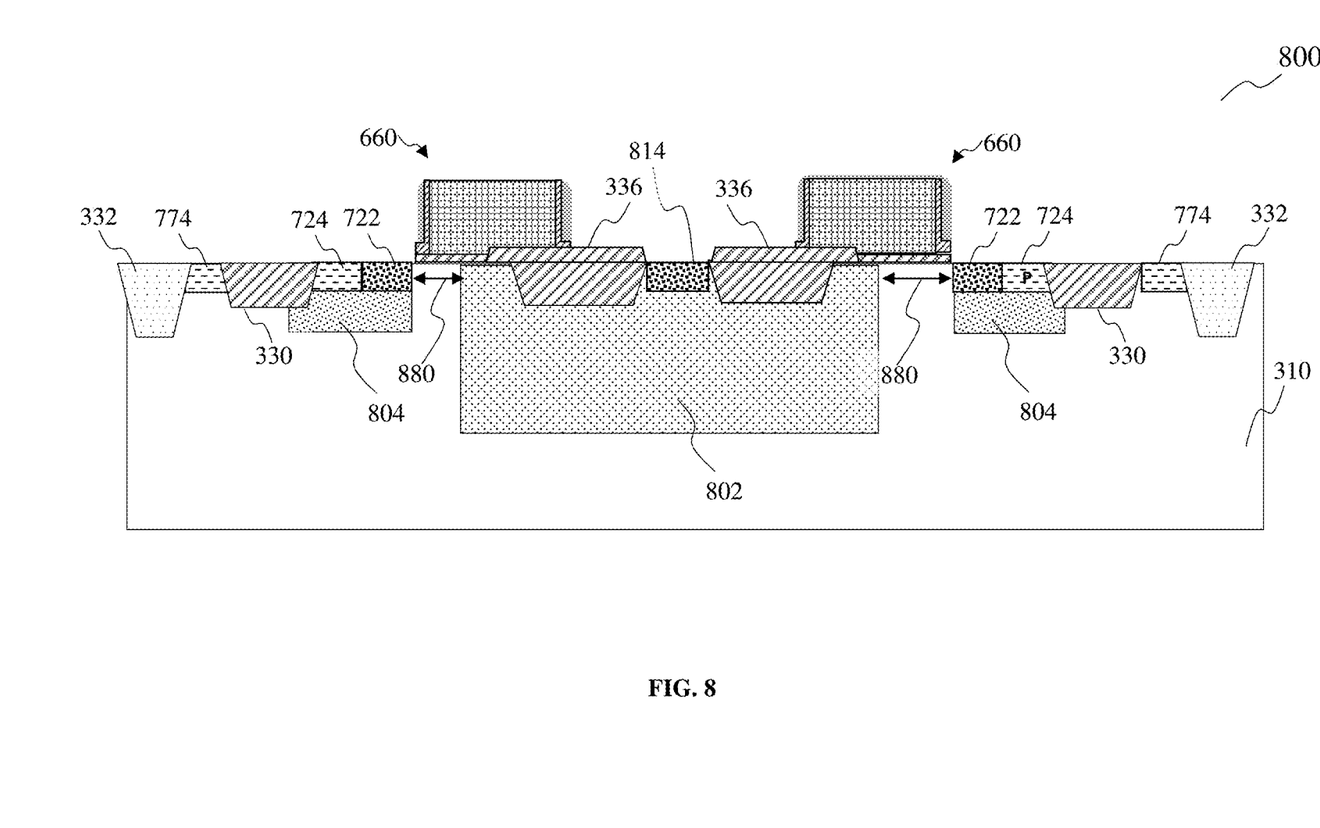
FIG. 8 shows a cross-sectional view of a transistor device according to various embodiments.

FIG. 8 shows a cross-sectional view of a LDMOS transistor device 800 according to various embodiments. The transistor device 800 may be similar to the transistor device 700, in that it may also be a LDMOS transistor that includes a pair of gate terminals 660, a pair of insulator structures, a pair of source terminals, a drain terminal and a pair of channel regions 880. The transistor device 800 may be a p-LDMOS transistor with low on-resistance. The transistor device 800 may include a substrate 310. The substrate 310 may include a drain extension implant region 802 and a pair of body regions 804. Each channel region 880 may lie between a respective body region 804 and the drain extension implant region 802. The transistor device 800 may include an n+ region 724 and a p+ region 722 formed within the substrate 310 and above each respective body region 804. The transistor device 800 may include another n+ region 774 in the substrate 310. The other n+ region 774 may be separated from the n+ region 724 by a USTI 330b. A STI 332 may be disposed adjacent to the n+ region 774. The n+ region 774 may form the drain terminal of the transistor device 800. The p+ region 722 may form the source terminal of the transistor device 800. The transistor device 800 may include an n+ region 814 within the drain extension implant region 802. The transistor device 800 may include a gate terminal 660 arranged over the substrate 310. The gate terminal 660 may be identical to the gate terminal described with respect to FIG. 6. The transistor device 800 may include at least one insulator structure that includes an oxide member 336 and a USTI 330a. The insulator structure may be identical to, or at least similar to, the insulator structure 340 formed according to the method described with respect to FIGS. 3A to 3H. The oxide member 336 may be disposed at least partially under the gate terminal 660. The oxide member 336 may overlap at least one corner of the USTI 330a that lies vertically under the gate terminal 650. The oxide member 336 may at least partially overlap a top surface of the USTI 330a that lies under the gate terminal 660. In other words, the oxide member 336 may at least partially cover a region of the USTI 330a that is under the gate terminal 660. The oxide member 336 may separate the USTI 330a from the gate terminal 660.

According to various embodiments, a transistor device may be provided. The transistor device may include any one of the transistor devices 600, 700 or 800. The transistor device may include a substrate, for example the substrate 310. The transistor device may include a drain terminal, for example the n+ region 614 or 814, formed in the substrate. The transistor device may include a source terminal, for example, the p+ region 622 or the n+ region 774, formed in the substrate. The transistor device may include a gate terminal, for example the gate terminal 660, formed over the substrate. The transistor device may include an insulator structure, for example the insulator structure 340. The insulator structure may be arranged between the drain terminal and the source terminal, and at least partially under the gate terminal. The insulator structure may include an oxide member, for example, the oxide member 336, formed over a trench isolation region. The trench isolation region may be for example, the USTI 330 or 330a.

According to various embodiments, the transistor device may further include a further source terminal, a further gate terminal, and a further insulator structure. In other words, the transistor device may include a single drain terminal, a pair of source terminals, and a pair of gate terminals. The transistor may include a pair of insulator structures. Each insulator structure may be arranged between the drain terminal and a respective source terminal. Each insulator structure may be arranged at least partially under a respective gate terminal.

Figure 9:
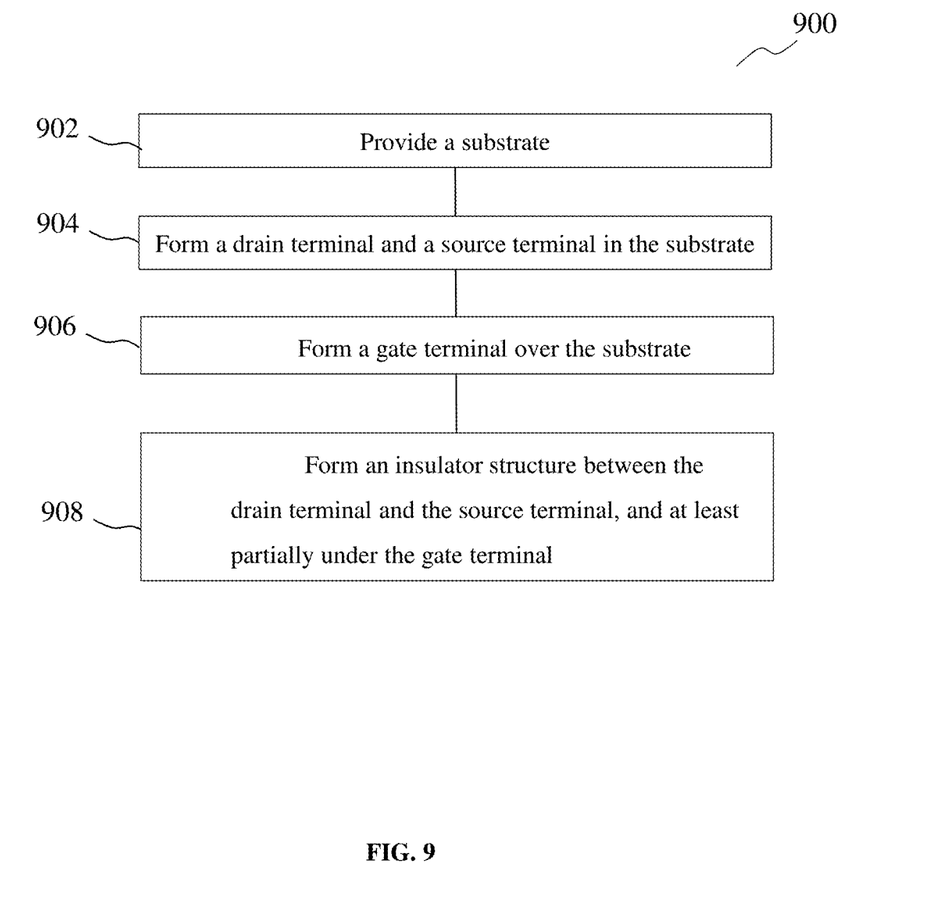
FIG. 9 shows a flow diagram of a method of forming a transistor device according to various embodiments.

FIG. 9 shows a flow diagram 900 of a method of forming a transistor device according to various embodiments. The transistor device may be a LDMOS transistor. The transistor device may be any one of the transistor devices 600, 700 or 800. The method may include providing a substrate, in 902. The method may include forming a drain terminal and a source terminal in the substrate, in 904. The method may include forming a gate terminal over the substrate, in 906. Forming the gate terminal may include forming the gate terminal partially over the oxide member. The method may include forming an insulator structure between the gate terminal and the source terminal, and at least partially under the gate terminal, in 908. Forming the insulator structure may include the processes 300A to 300H. Forming the insulator structure may include forming an oxide member over a trench isolation region.

According to various embodiments, the method of forming the transistor device may further include forming a further source terminal in the substrate, forming a further gate terminal over the substrate, and forming a further insulator structure between the drain terminal and the further source terminal and at least partially under the further gate terminal. Forming the further gate terminal may include forming the further gate terminal partially over the oxide member. The process for forming the further insulator structure may be identical to the process for forming the insulator structure.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

It will be appreciated to a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. A transistor device comprising:
   a substrate;
   a first terminal, a second terminal and a third terminal formed in the substrate, and a gate terminal formed over the substrate;
   an insulator structure arranged between the first terminal and a first end of the second terminal, and at least partially under the gate terminal,
   wherein the insulator structure comprises an oxide member and a trench isolation region,
   wherein the oxide member is at least partially formed over the trench isolation region, and
   wherein the trench isolation region is an ultra-shallow trench isolation region;
   a shallow trench isolation region disposed adjacent to the third terminal, wherein the shallow trench isolation region is separated from the insulator structure; and
   a further ultra-shallow trench isolation region disposed between the shallow trench isolation region and the trench isolation region and between a second end of the second terminal and the third terminal.

2. The transistor device of claim 1, further comprising:
a further source terminal;
a further gate terminal; and
a further insulator structure comprising a further oxide member and a further trench isolation region,
wherein the further insulator structure is arranged between the drain terminal and the further source terminal, at least partially under the further gate terminal, and wherein the further oxide member is at least partially formed over the further trench isolation region.

3. The transistor device of claim 1, wherein the oxide member is formed over the substrate, and wherein the trench isolation region is formed in the substrate.

4. The transistor device of claim 1, wherein the oxide member overlaps a corner of the trench isolation region that lies under the gate terminal.

5. The transistor device of claim 1, wherein the oxide member at least substantially overlaps a portion of the trench isolation region that lies under the gate terminal.

6. The transistor device of claim 1, wherein the oxide member overlaps an entire upper surface of the trench isolation region, wherein the upper surface faces the gate terminal.

7. The transistor device of claim 1, wherein the oxide member is in direct contact with the trench isolation region.

8. The transistor device of claim 1, wherein the oxide member and the trench isolation region are identical in material composition.

9. The transistor device of claim 1, wherein a depth of the ultra-shallow trench isolation region is 90 to 120 nm.

10. The transistor device of claim 1,
wherein the further ultra-shallow trench isolation region is partially disposed in the second terminal.

11. The transistor device of claim 1, wherein the first terminal is a drain terminal and the third terminal is a source terminal or wherein the second terminal is a source and body terminal and the third terminal is a drain terminal.

12. A method of forming a transistor device, the method comprising:
providing a substrate;
forming a first terminal, a second terminal and a third terminal in the substrate;
forming a gate terminal over the substrate;
forming an insulator structure between the first terminal and a first end of the source second terminal, and at least partially under the gate terminal,
wherein forming the insulator structure comprises forming a trench isolation region and forming an oxide member at least partially over the trench isolation region, and
wherein the trench isolation region is an ultra-shallow trench isolation region;
forming a shallow trench isolation region disposed adjacent to the third terminal, wherein the shallow trench isolation region is separated from the insulator structure; and
forming a further ultra-shallow trench isolation region disposed between the shallow trench isolation region and the trench isolation region and between a second end of the second terminal and the third terminal.

13. The method of claim 12, wherein forming the insulator structure comprises forming the trench isolation region in the substrate and forming the oxide member over the substrate.

14. The method of claim 12, wherein forming the oxide member comprises depositing an oxide material over the trench isolation.

15. The method of claim 14, wherein depositing the oxide material comprises depositing the oxide material by high temperature oxidation process or in-situ steam generation process.

16. The method of claim 14, wherein forming the oxide member further comprises etching the deposited oxide material.

17. The method of claim 14, wherein forming the oxide member further comprises partially removing portions of the deposited oxide material that are in direct contact with the substrate.

18. The method of claim 12, wherein forming the gate terminal comprises forming the gate terminal partially over the oxide member.

19. The method of claim 12, further comprising:
forming a further source terminal in the substrate;
forming a further gate terminal over the substrate; and
forming a further insulator structure between the drain terminal and the further source terminal, at least partially under the further gate terminal, wherein forming the further insulator structure comprises forming a further trench isolation region and forming a further oxide member at least partially over the further trench region.

20. The method of claim 19, wherein forming the further gate terminal comprises forming the further gate terminal partially over the oxide member.

\* \* \* \* \*